United States Patent
Childs et al.

(10) Patent No.: US 10,840,806 B2
(45) Date of Patent: Nov. 17, 2020

(54) PREVENTING SUB-HARMONIC OSCILLATION WITH CLOCK DELAY COMPENSATION, IN A DC-DC SWITCHING CONVERTER

(71) Applicant: Dialog Semiconductor (UK) Limited, London (GB)

(72) Inventors: Mark Childs, Swindon (GB); Jens Masuch, Munich (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/604,718

(22) Filed: May 25, 2017

(65) Prior Publication Data

US 2018/0342952 A1 Nov. 29, 2018

(51) Int. Cl.
| | |
|---|---|
| H02M 3/158 | (2006.01) |
| H03K 5/135 | (2006.01) |
| H02M 1/14 | (2006.01) |
| H02M 3/155 | (2006.01) |

(52) U.S. Cl.
CPC .............. *H02M 3/158* (2013.01); *H02M 1/14* (2013.01); *H02M 3/155* (2013.01); *H03K 5/135* (2013.01)

(58) Field of Classification Search
CPC .......... H02M 3/155–1588; H02M 1/12; H03K 5/135
See application file for complete search history.

(56) References Cited

U.S. PATENT DOCUMENTS 3,292,003 A * 12/1966 Sear .................. H03K 19/10
326/134
6,166,528 A * 12/2000 Rossetti .............. H02M 3/1588
323/283

(Continued)

FOREIGN PATENT DOCUMENTS

CN 201837850 5/2011

OTHER PUBLICATIONS

German Office Action, File No. 10 2017 217 052.2, Applicant: Dialog semiconductor (UK) Limited, dated May 24, 2018, 7 pgs, and English language translation, 10 pgs.

(Continued)

*Primary Examiner* — Yusef A Ahmed
(74) *Attorney, Agent, or Firm* — Saile Ackerman LLC; Stephen B. Ackerman

(57) ABSTRACT

The clock input of a buck converter is delayed, and the delay is controlled proportionally to the preceding high-side output switch on time. In the steady state, the high-side switch on time is uniform, and the clock is offset by a fixed amount. When sub-harmonic oscillation begins to occur, the high-side switch on time may increase during a cycle. The longer high-side on time causes the clock to be delayed by an increased amount. This has the effect of increasing the following low-side output switch on time. This further increases the subsequent high-side on time, and counteracts the effects of sub-harmonic oscillation. If the system is properly controlled, loop compensation is implemented correctly and sub-harmonic oscillation is prevented. In addition, the scheme may also be configured for the delay to be controlled proportionally to the preceding low-side output switch on time of the buck converter.

4 Claims, 10 Drawing Sheets

(56) References Cited

U.S. PATENT DOCUMENTS

| | | | |
|---|---|---|---|
| 6,396,250 B1* | 5/2002 | Bridge | H02M 3/1588 323/283 |
| 6,597,157 B1* | 7/2003 | Boeckmann | G05F 1/618 323/242 |
| 6,798,177 B1* | 9/2004 | Liu | H02M 3/1582 323/222 |
| 7,151,396 B2 | 12/2006 | Vig et al. | |
| 7,423,414 B1* | 9/2008 | Culpepper | H02M 3/1563 323/280 |
| 7,598,715 B1* | 10/2009 | Hariman | H02M 3/1588 323/222 |
| 7,705,579 B1* | 4/2010 | Hariman | H02M 3/156 323/284 |
| 9,685,868 B2* | 6/2017 | de Cremoux | H02M 3/157 |
| 9,866,118 B2* | 1/2018 | Shook | G05F 1/10 |
| 9,887,625 B2* | 2/2018 | Ozawa | H02M 3/158 |
| 2002/0084809 A1* | 7/2002 | Okuno | H02M 3/1588 327/108 |
| 2002/0125869 A1* | 9/2002 | Groom | H02M 3/1584 323/283 |
| 2005/0057228 A1* | 3/2005 | Shih | H02M 1/38 323/222 |
| 2005/0083024 A1* | 4/2005 | Harris | H02J 1/102 323/282 |
| 2005/0102643 A1 | 5/2005 | Hou et al. | |
| 2006/0049863 A1* | 3/2006 | Endo | G06F 1/10 327/295 |
| 2007/0126410 A1* | 6/2007 | Figoli | H02M 1/38 323/283 |
| 2008/0012540 A1* | 1/2008 | Chen | H02M 1/38 323/224 |
| 2008/0049473 A1* | 2/2008 | Sugahara | H02M 3/156 363/89 |
| 2008/0252277 A1* | 10/2008 | Sase | H02M 3/157 323/283 |
| 2008/0252280 A1* | 10/2008 | Prodic | H02M 3/157 323/283 |
| 2009/0141595 A1* | 6/2009 | Huang | G04F 10/005 368/118 |
| 2011/0018507 A1* | 1/2011 | McCloy-Stevens | H02M 3/1588 323/271 |
| 2011/0018516 A1* | 1/2011 | Notman | H02M 3/1588 323/284 |
| 2011/0182088 A1* | 7/2011 | Lidak | H02M 3/33507 363/21.12 |
| 2012/0074922 A1* | 3/2012 | Suzuki | H02M 3/155 323/312 |
| 2012/0119718 A1* | 5/2012 | Song | H02M 3/1588 323/284 |
| 2012/0133348 A1* | 5/2012 | Fan | H02M 3/1588 323/284 |
| 2012/0249093 A1* | 10/2012 | Grbo | H02M 3/1588 323/234 |
| 2012/0250367 A1* | 10/2012 | Desimone | H02M 1/44 363/21.17 |
| 2013/0193938 A1* | 8/2013 | Shook | G05F 1/10 323/271 |
| 2013/0207629 A1* | 8/2013 | Engelhardt | H02M 3/156 323/282 |
| 2014/0300329 A1* | 10/2014 | Thompson | H03K 5/1536 323/235 |
| 2014/0354250 A1* | 12/2014 | Deng | H02M 3/1582 323/271 |
| 2015/0214825 A1* | 7/2015 | Wahby | H02M 3/156 363/21.01 |
| 2015/0303800 A1* | 10/2015 | Childs | H02M 3/158 323/271 |
| 2016/0006337 A1 | 1/2016 | Thalheim et al. | |
| 2016/0065062 A1* | 3/2016 | Teh | H02M 3/157 323/283 |
| 2016/0233768 A1* | 8/2016 | de Cremoux | H02M 3/157 |
| 2016/0233771 A1* | 8/2016 | Chen | H02M 3/158 |
| 2016/0276932 A1* | 9/2016 | Pullen | H02M 3/158 |
| 2017/0085168 A1* | 3/2017 | Laur | H02M 3/158 |
| 2017/0294839 A1* | 10/2017 | de Cremoux | H02M 3/157 |
| 2017/0324345 A1* | 11/2017 | Stuler | H02M 3/3376 |
| 2018/0054113 A1* | 2/2018 | Kim | H02M 1/12 |

OTHER PUBLICATIONS

"On-Chip Compensated Wide Output Range Boost Converter with Fixed-Frequency Adaptive Off-Time Control for LED Driver Applications," by Lin Cheng et al., IEEE Transactions on Power Electronics, vol. 30, No. 4, Apr. 2015, pp. 2096-2107.

* cited by examiner

PREVENTING SUB-HARMONIC OSCILLATION WITH CLOCK DELAY COMPENSATION, IN A DC-DC SWITCHING CONVERTER

BACKGROUND OF THE INVENTION

Field of the Invention

The present disclosure relates generally to Buck, Boost, and other types of switching converters, and more specifically to peak-current-mode, valley-mode control, and sub-harmonic oscillation in a switching converter.

Description of Related Art

The difference between the average inductor current and the dc value of the sampled inductor current can cause instability for certain operating conditions. This instability is known as sub-harmonic oscillation, which occurs when the inductor ripple current does not return to its initial value by the start of the next switching cycle. Sub-harmonic oscillation is normally characterized by observing alternating wide and narrow pulses at the switching node. A peak-current-mode switching converter requires a compensation signal to be subtracted at higher duty-cycles to prevent sub-harmonic oscillation, and that a valley-mode control switching converter requires a compensation signal to be added at higher duty-cycles to prevent sub-harmonic oscillation.

By subtracting or adding a compensation signal to the output of the error ramp, it is possible to stabilize a peak-current-mode or valley-mode control switching converter for all duty cycles. In some systems, this compensation ramp can have negative effects on the wider system, and the control loop no longer behaves like a current converter.

SUMMARY OF THE INVENTION

Accordingly, it is an object of one or more embodiments of the present disclosure to provide a method to prevent sub-harmonic oscillation in a switching regulator, configured for peak-current-mode or valley-mode control, allowing the switching regulator to remain fully stable.

To accomplish the above and other objects, a current-mode switching regulator is disclosed, comprised of a high-side switch and a low-side switch. The current-mode switching regulator is further comprised of a system clock, for synchronizing the switching regulator, and a clock delay generation circuit, with a clock signal from the system clock as an input, for generating a delayed-clock signal for turning on the high-side switch or the low-side switch. The current-mode switching regulator is further comprised of a counter, for determining the required delay for the delayed-clock signal, and a delay cell, for delaying the system clock input to the switching regulator. The current-mode switching regulator is further comprised of a switching control block, for implementing a current limit with peak-mode compensation, wherein the high-side and low-side switches supply coil current to an inductor.

The above and other objects are further achieved by a method for preventing sub-harmonic oscillation in a current-mode switching regulator. A high-side switch and a low-side switch are provided. A system clock synchronizes the switching regulator. A clock delay generation circuit, with a clock signal from the system clock as an input, is provided. A delayed-clock signal for turning on the high-side switch or the low-side switch is generated.

In various embodiments the function may be achieved by implementing a switching regulator, configured for peak-mode current control.

In various embodiments the function may be achieved by implementing a switching regulator, configured for valley-mode current control.

In various embodiments the function may be achieved by implementing a clock delay generation circuit, configured to delay a next clock pulse by an amount of time directly proportional to the most recent on time of the high-side switch, for peak-mode current control.

In various embodiments the function may be achieved by implementing a clock delay generation circuit, configured to delay a next clock pulse by an amount of time inversely proportional to the most recent on time of the low-side switch, for peak-mode current control.

In various embodiments the function may be achieved by implementing a clock delay generation circuit, configured to delay a next clock pulse by an amount of time directly proportional to the most recent on time of the low-side switch, for valley-mode current control.

In various embodiments the function may be achieved by implementing a clock delay generation circuit, configured to delay a next clock pulse by an amount of time inversely proportional to the most recent on time of the high-side switch, for valley-mode current control.

In various embodiments the function may be achieved by implementing a clock delay generation circuit, configured to delay a next clock pulse by an amount of time inversely proportional to the clock minus the most recent on time of the high-side switch, for valley-mode current control.

In various embodiments the function may be achieved by implementing a switching converter comprised of a PMOS high side device and an NMOS low side device.

In various embodiments the function is achieved by implementing a switching regulator configured for voltage mode operation.

BRIEF DESCRIPTION OF THE DRAWINGS

The present disclosure will be more clearly understood from the following description taken in conjunction with the accompanying drawings in which like reference numerals designate similar or corresponding elements, regions and portions and in which.

DETAILED DESCRIPTION OF THE INVENTION

Compensation ramps remove sub-harmonic oscillation in peak-current-mode and valley-mode control switching converters, when the control loop is controlling the peak-current. When the buck converter hits the current limit, included to prevent damage to the buck or any loads supplied by the buck, the peak-current is fixed and the compensation ramp ceases to have any effect. At this point the buck will suffer sub-harmonic oscillation. The disclosure provides a method of preventing sub-harmonic oscillation, which allows the switching converter to remain fully stable, even when in current limit, increasing the maximum current.

Figure 1:
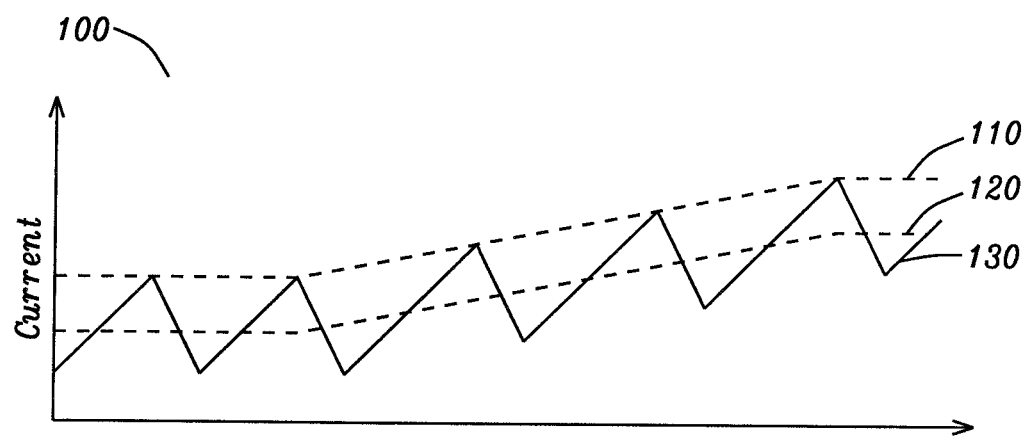
FIG. 1 shows the coil current of a buck converter, compared to the peak current and defined range of the open loop gain, of the prior art.

FIG. 1 shows the coil current of a buck converter, compared to the peak-current and defined range of the open loop gain, of the prior art. In buck converter 100, the high-side output switch of the buck converter is turned on by a clock signal. Once the switch is on, current 130 in the coil increases linearly. Once the current in the coil reaches a threshold 110, the high-side switch device is turned off, and the low-side output switch of the buck converter is turned on. Current 130 in the coil then falls. At the next clock edge, the high-side switch is turned back on and the cycle repeats. By controlling the peak-current to be proportional to the output voltage error VDAC-VOUT, the buck converter can be made to regulate. This system is relatively stable by design so long as open loop gain 120 is kept within a defined range.

Figure 2:
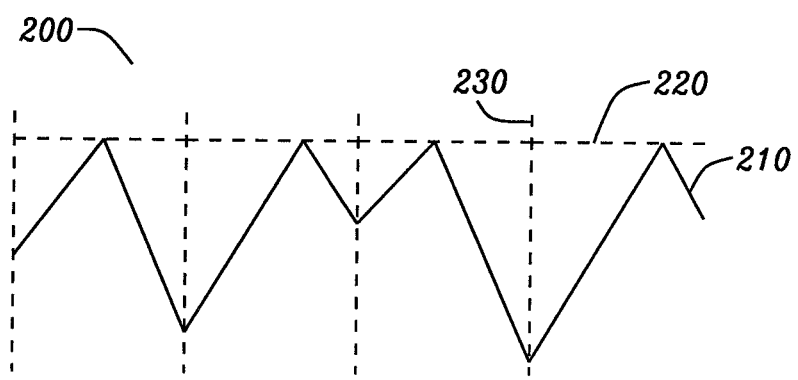
FIG. 2 illustrates the coil current of a buck converter, suffering sub-harmonic oscillation.

FIG. 2 illustrates the coil current of a buck converter, suffering sub-harmonic oscillation. If the duty cycle increases to the point where the low-side output switch of the buck converter is on for longer than the high-side output switch of buck converter 200, the system can suffer a form of large-signal instability referred to as sub-harmonic oscillation. Peak-current 220 is controlled, and clock 230 always turns on the high-side switch. Coil current 210 is following all the rules of the system, but the system is unstable.

Figure 3:
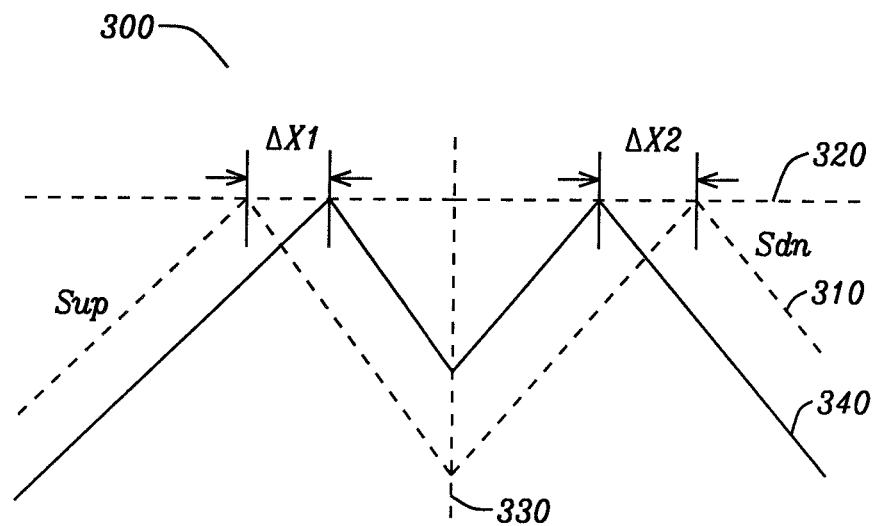
FIG. 3 shows the coil current of a buck converter, for an unstable system.

FIG. 3 shows the coil current of a buck converter, for an unstable system. System 300 is said to be unstable if a disturbance in the turn-off time $\Delta X1$ of coil current 310 grows in magnitude over a cycle, such that $\Delta X2 > \Delta X1$, and turn-off time $\Delta X2$ is with respect to coil current 340. The condition for this is when the down-slope of coil current 310 is greater than its up-slope, when SDN>SUP. The traditional method to remove sub-harmonic oscillation is to add a compensation ramp to the up-slope of current 310 to make its effective ramp up-slope greater than its down-slope. However, this method stops working when the buck converter is in peak-current-mode. For this case, the coil current is measured against reference current 320 and the high-side output switch of the buck converter is turned off immediately with clock 330. This prevents the coil current from going above the peak-current limit, and bypassing the loop that uses the compensation ramp.

The compensation ramp may still be used, but the current limit is no longer directly limiting the coil current. The maximum coil current would be lower than the ideal current limit value. The limit may be raised to compensate for this shift, but the effective current limit value still varies with duty cycle, meaning that as the supply voltage changes, or as the output voltage varies, the current limit also varies.

The disclosure proposes that the high-side output switch of the buck converter is not turned on directly with the clock. Instead, the clock is delayed, and the delay is controlled proportionally to the preceding high-side switch on time. In the steady state, the high-side on times are uniform, and the clock is offset by a fixed amount. When sub-harmonic oscillation begins to occur, the high-side on time might increase during a cycle. This would normally have the effect of creating a short low-side switch turn on time. This would mean the next high-side turn-on time would also be short, and sub-harmonic oscillation would become established.

For the disclosure, the longer high-side on time causes the clock to be delayed by an increased amount. This has the effect of increasing the following low-side on time, which would previously have been too short. This further increases the subsequent high-side on time, and counteracts the effects of sub-harmonic oscillation. If this system is properly controlled, the proposal both implements loop compensation correctly and prevents sub-harmonic oscillation. The scheme is effectively adding a form of clock delay compensation, such that the system will not suffer sub-harmonic oscillation even when in current limit mode.

Figure 4:
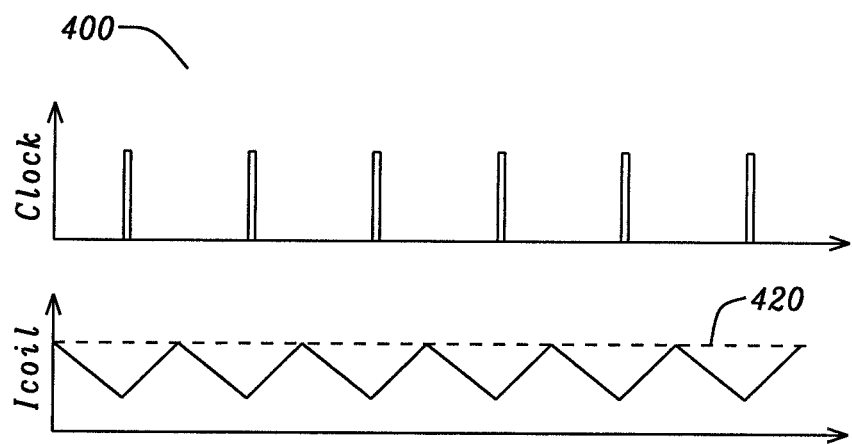
FIG. 4 illustrates the clocking in a traditional peak-current-mode buck converter, of the prior art.

FIG. 4 illustrates the clocking in a traditional peak-current-mode buck converter, of the prior art. In 400, the high-side output switch of the buck converter is turned on by clock signal CLOCK. Once the switch is on, the current in the coil, ICOIL, increases linearly. Once the current in the coil reaches threshold 420, the high-side switch device is turned off, and the low-side output switch of the buck converter is turned on. Current ICOIL then falls until the next clock cycle.

Figure 5:
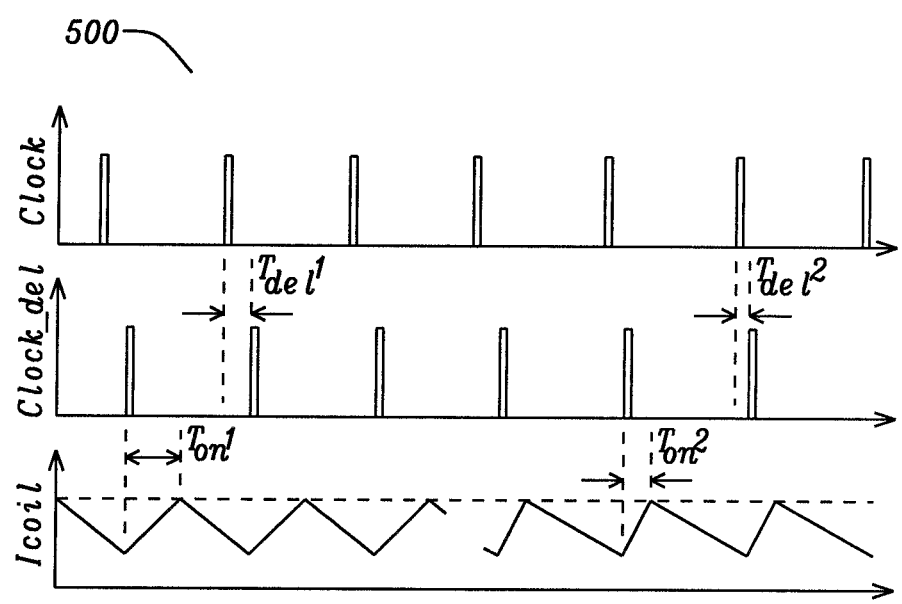
FIG. 5 shows the clocking of a buck converter delayed, in peak-current-mode, proportional to the on time of the preceding high-side output switch, in a first preferred embodiment of the present disclosure.

FIG. 5 shows the clocking of a buck converter delayed, in peak-current-mode, proportional to the on time of the preceding high-side output switch of the buck converter, in a first preferred embodiment of the present disclosure. In 500, clock signal CLOCK is delayed in clock signal CLOCK_DEL, and the delayed clock turns on the high-side switch. If the on time of the high-side switch for ICOIL, TON1, is relatively long, then the clock delay, TDEL1, is also relatively long. If the on time of the high-side switch for ICOIL, TON2, is relatively short, then the clock delay, TDEL2, is also relatively short.

Figure 6:
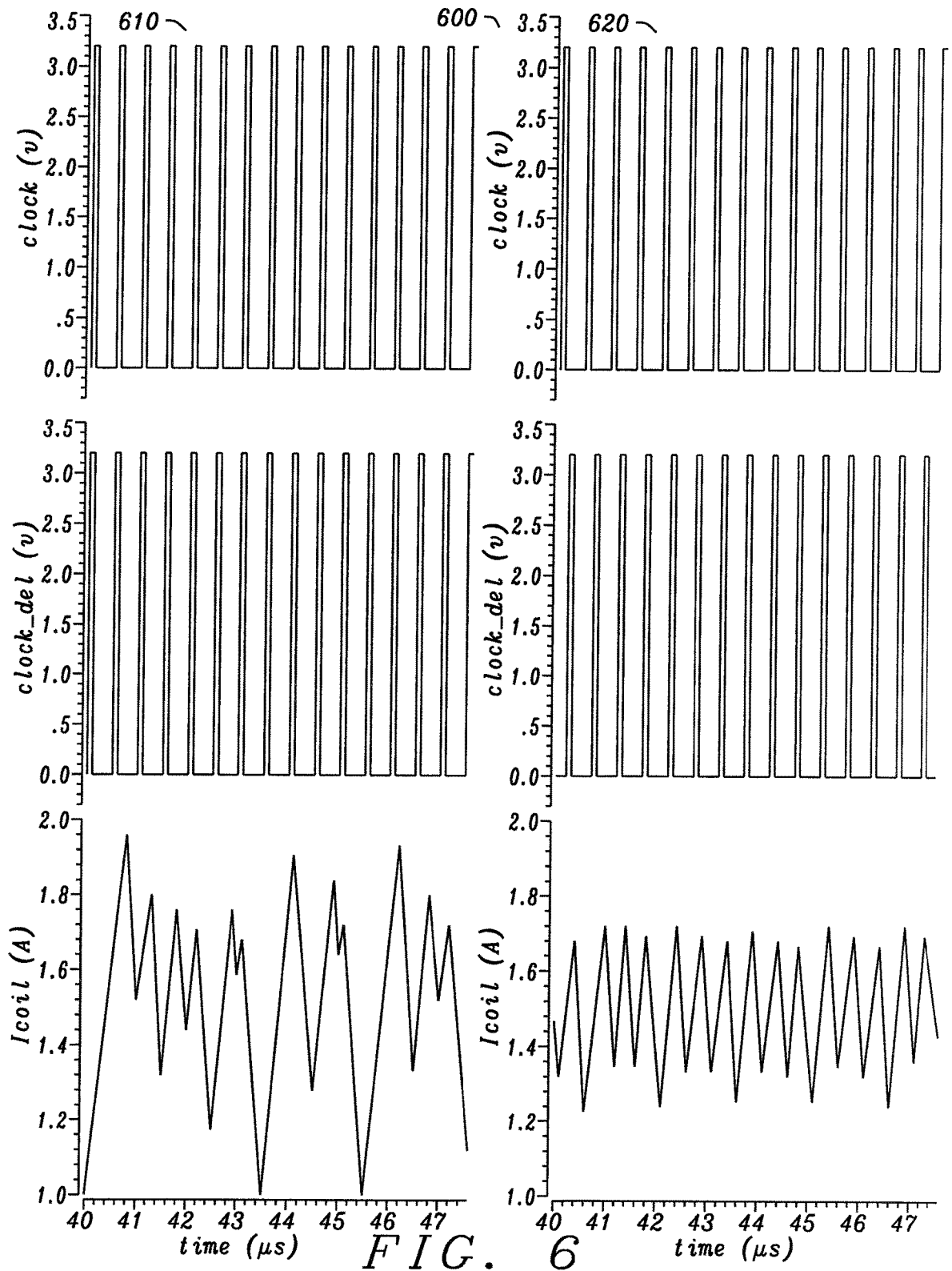
FIG. 6 illustrates a simulation of the clocking of a buck converter with no clock compensation delay, compared to a system with clock compensation delay, and proportional to the on time of the preceding high-side output switch.

FIG. 6 illustrates a simulation of the clocking of a buck converter with no clock compensation delay, compared to a system with clock compensation delay, and proportional to the on time of the preceding high-side output switch of the buck converter. In 600, besides clock compensation delay, all other variables remain the same between the two simulations, and the buck converter is operating with a duty-cycle of 50%. In simulation 610, the system is shown with no compensation delay present. The delayed clock, CLOCK_DEL, is completely synchronous to the main clock, CLOCK, and the coil current, ICOIL, shows sub-harmonic behavior. In simulation 620, the system is shown with compensation delay present. The delayed clock, CLOCK_DEL, is no longer synchronous to the main clock, CLOCK, and the sub-harmonic oscillation of the coil current, ICOIL, is dramatically reduced.

Figure 7:
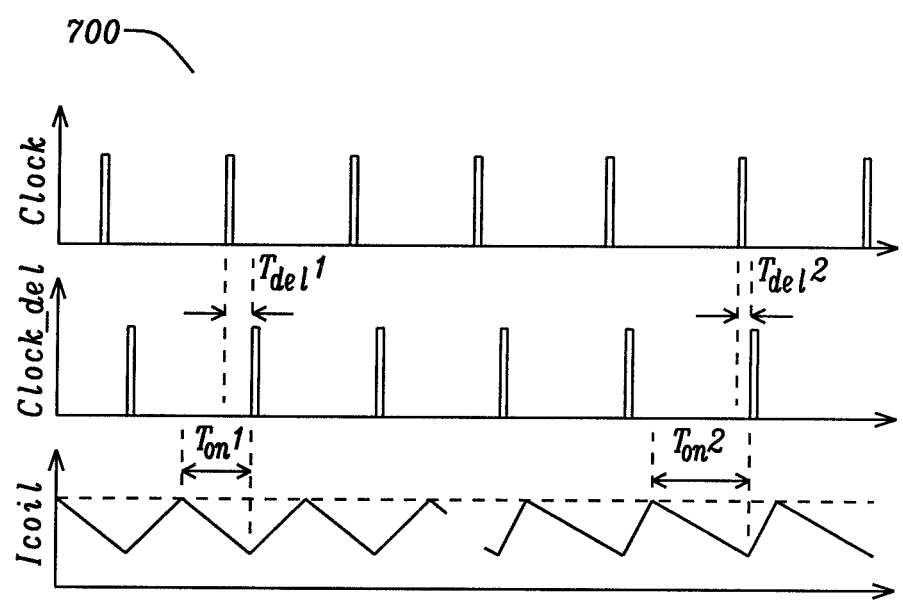
FIG. 7 shows the clocking of a buck converter delayed, and inversely proportional to the on time of the preceding low-side output switch, in a second preferred embodiment of the present disclosure.

FIG. 7 shows the clocking of a buck converter delayed, and inversely proportional to the on time of the preceding low-side output switch of the buck converter, in a second preferred embodiment of the present disclosure. This variant is where the delay is no longer proportional to the high-side output switch on time, but is now inversely proportional to the low-side switch on-time. In 700, the longer the low-side switch is on for, the shorter the clock delay will be. Clock signal CLOCK is delayed creating clock signal CLOCK_DEL, and the delayed clock turns on the high-side switch of the buck converter. If the on time of the low-side switch for ICOIL, TON1, is relatively short, then the clock delay for CLOCK_DEL, TDEL1, is relatively long. If the on time of the low-side switch for ICOIL, TON2, is relatively long, then the clock delay for CLOCK_DEL, TDEL2, is relatively short.

Figure 8:
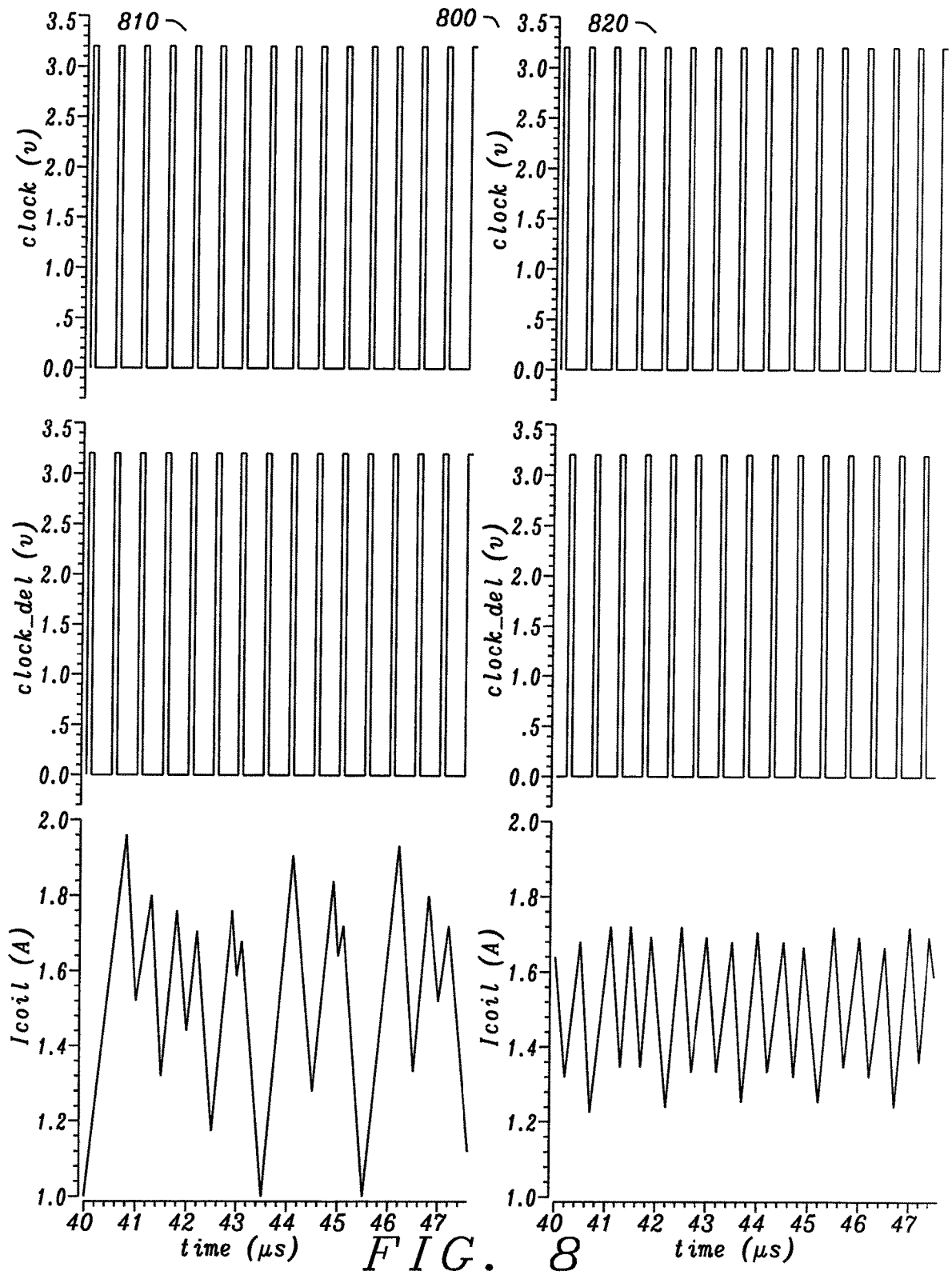
FIG. 8 illustrates a simulation of the clocking of a buck converter with no clock compensation delay, compared to a system with clock compensation delay, and inversely proportional to the on time of the preceding low-side output switch.

FIG. 8 illustrates a simulation of the clocking of a buck converter with no clock compensation delay, compared to a system with clock compensation delay, and inversely proportional to the on time of the preceding low-side output switch of the buck converter. In 800, besides clock compensation delay, all other variables remain the same between the two simulations, and the buck converter is operating with a duty-cycle of 50%. In simulation 810 the system is shown with no compensation delay present. The delayed clock, CLOCK_DEL, is completely synchronous to the main clock, CLOCK, and the coil current, MOIL, shows sub-harmonic behavior. In simulation 820 the system is shown with compensation delay present. The delayed clock, CLOCK_DEL, is no longer synchronous to the main clock, CLOCK, and the sub-harmonic oscillation of the coil current, MOIL, is dramatically reduced.

Figure 9:
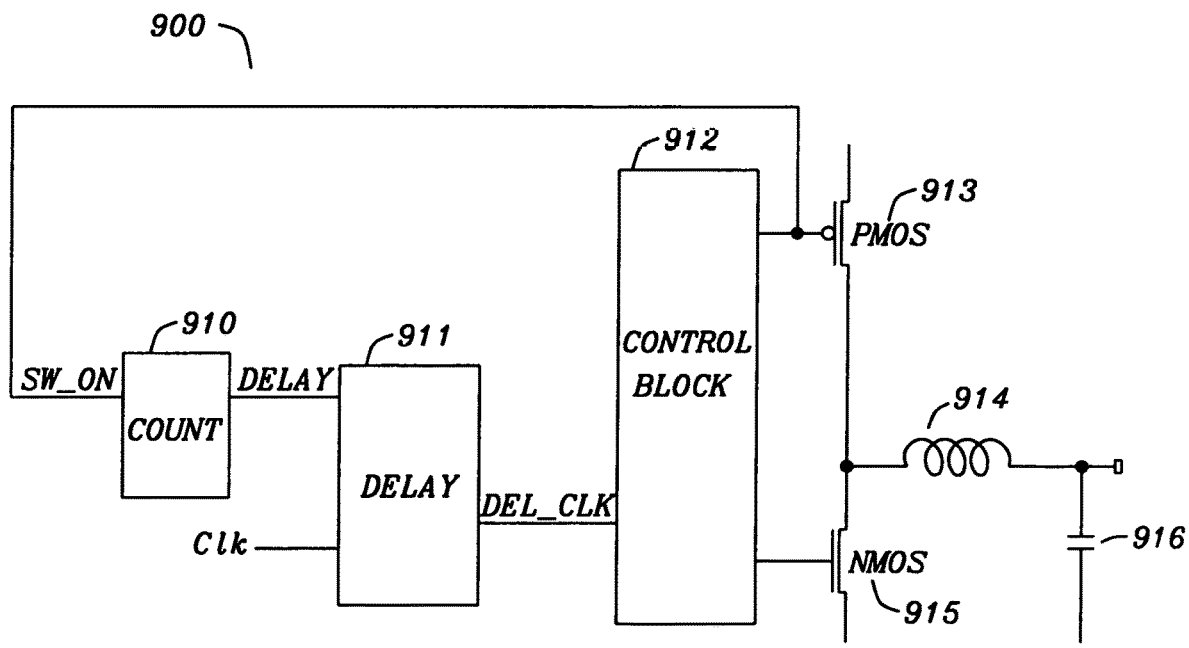
FIG. 9 shows a circuit for the implementation of a buck converter with clocking delayed, proportional to the on time of the preceding high-side output switch, corresponding to the timing diagram of FIG. 5.

FIG. 9 shows a circuit for the implementation of a buck converter with clocking delayed, proportional to the on time of the preceding high-side output switch, corresponding to the timing diagram of FIG. 5. In 900, the on time of the high-side output switch SW_ON is measured using counter COUNT 910. The counter then outputs signal DELAY to delay cell 911. The delay cell then receives the master clock CLK and outputs a delayed clock DEL_CLK to buck control block 912. The buck control block then controls output switches PMOS 913 and NMOS 915.

High-side device 913 is turned on by clock signal DEL_CLK. When the switch is on, the current in coil 914 increases linearly. Once the current in the coil reaches a threshold, high-side device 913 turns off, and the voltage is stored on capacitor 916. Low-side device 915 turns on, and the current in coil 914 falls until the next clock cycle.

If the on time of the high-side switch is relatively long, depending on the duty cycle, then DEL_CLK is relatively long. If the on time of the high-side switch is relatively short, then DEL_CLK is relatively short.

Figure 13:
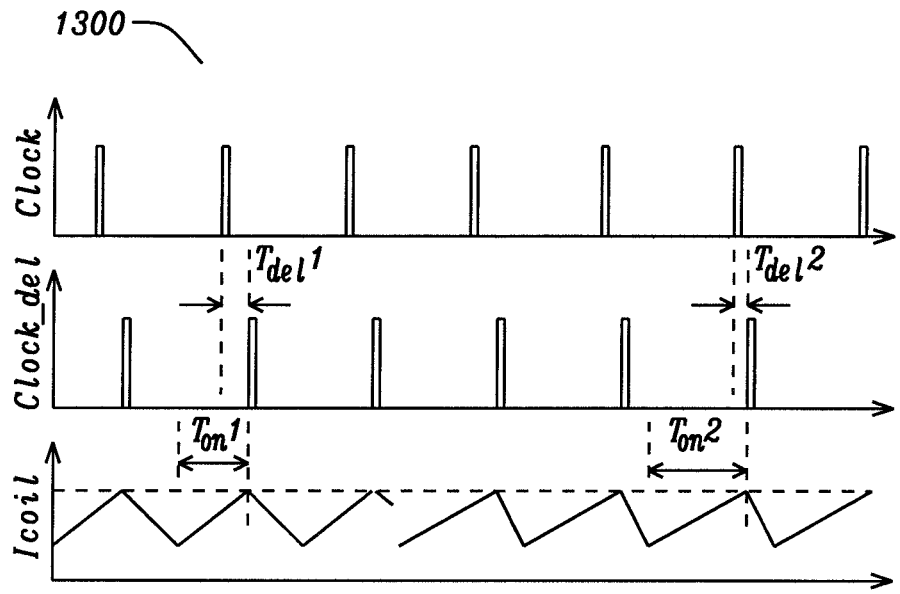
FIG. 13 shows the clocking of a valley-mode buck converter delayed, and inversely proportional to the on time of the preceding high-side output switch, in a fourth preferred embodiment of the present disclosure.
Figure 14:
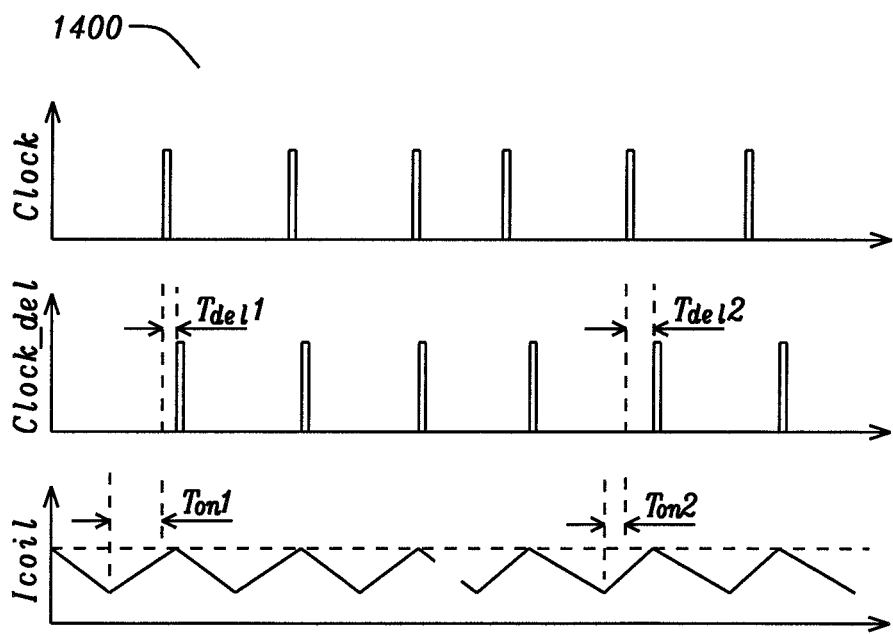
FIG. 14 shows the clocking of a buck converter delayed, in valley-mode current control, in a fifth preferred embodiment of the present disclosure.

The circuit in FIG. 9 may be used for the other embodiments of the disclosure dependent on the on-time of the high-side switch. The on-time of the high side switch is counted, and the count data is used to set the clock delay proportional or inversely proportional to the count data. The FIG. 9 circuit could used to delay a next clock pulse by an amount of time directly proportional to the most recent on time of the high-side switch for peak-mode current control as shown in FIG. 5, to delay a next clock pulse by an amount of time inversely proportional to the most recent on time of the high-side switch for valley-mode current control as shown in FIG. 13, or to delay a next clock pulse by an amount of time inversely proportional to the clock minus the most recent on time of the high-side switch for valley-mode current control as shown in FIG. 14.

Figure 10:
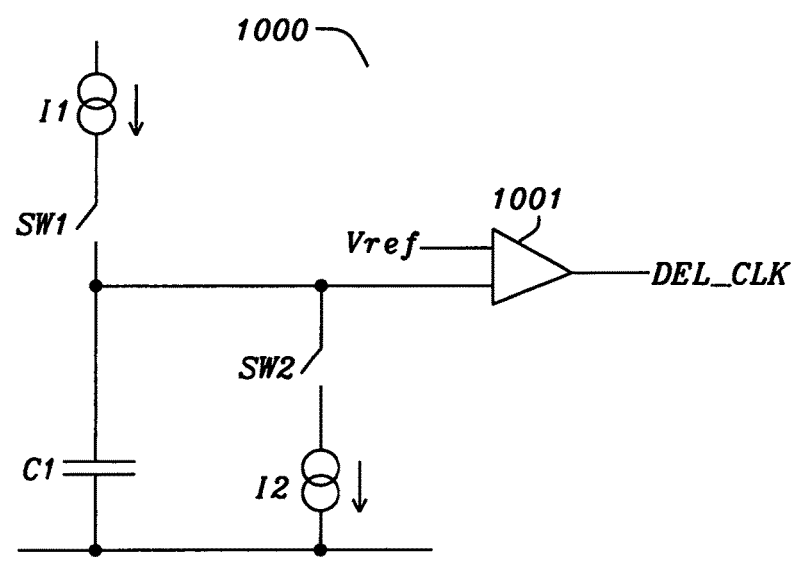
FIG. 10 illustrates an implementation for the delay cell and counter of a buck converter with clocking delayed, proportional to the on time of the preceding high-side output switch and corresponding to FIGS. 5 and 9.

Fig. 10 illustrates an implementation for the delay cell and counter of a buck converter with clocking delayed, proportional to the on time of the preceding high-side output switch and corresponding to FIGS. 5 and 9. In 1000, capacitor C1 charges with fixed bias current I1, for the time the high-side output switch is turned on and SW1 is closed. When the high-side output switch is turned off, and switch SW1 is opened, voltage data is stored on capacitor Cl. At the next clock edge, switch SW2 is closed, and remains closed until the clock signal DEL_CLK is set. While switch SW2 is closed, fixed bias current I2 discharges the voltage stored on capacitor C1. Eventually the voltage will fall below reference voltage VREF and clock signal DEL_CLK is set. When switch SW2 is opened, the voltage stored on C1 is the reference voltage VREF. The next cycle will start from VREF, and the effect of the reference voltage offset will be removed from subsequent samples. The amount of clock delay DEL_CLK, with respect to the high-side switch SW1 on time, is controlled by a function of fixed bias currents I1 and I2 and an amount of time the high-side switch is on.

The circuit in FIG. 10 may be used for the other embodiments dependent on the on-time of the high-side or low-side switch. Depending on whether switch SW1 is closed or switch SW2 is closed, the clock delay is proportional or inversely proportional to the count data used to set the clock delay. The FIG. 10 circuit could be used to delay a next clock pulse by an amount of time directly proportional to the most recent on time of the high-side switch for peak-mode current control as shown in FIG. 5, to delay a next clock pulse by an amount of time inversely proportional to the most recent on time of the high-side switch for valley-mode current control as shown in FIG. 13, or to delay a next clock pulse by an amount of time inversely proportional to the clock minus the most recent on time of the high-side switch for valley-mode current control as shown in FIG. 14. The FIG. 10 circuit could also be used to delay a next clock pulse by an amount of time inversely proportional to the most recent on time of the low-side switch for peak-mode current control as shown in FIG. 7, or to delay a next clock pulse by an amount of time directly proportional to the most recent on time of the low-side switch for valley-mode current control as shown in FIG. 11.

In various embodiments the function may be achieved and sub-harmonic oscillation reduced by implementing a switching converter, configured for valley-mode current control. In valley-mode control, the low side device is turned on by the clock and turned off by the control loop. The high side device on time is then defined only by the turn off time of the low side device, allowing for much higher switching frequencies.

Figure 11:
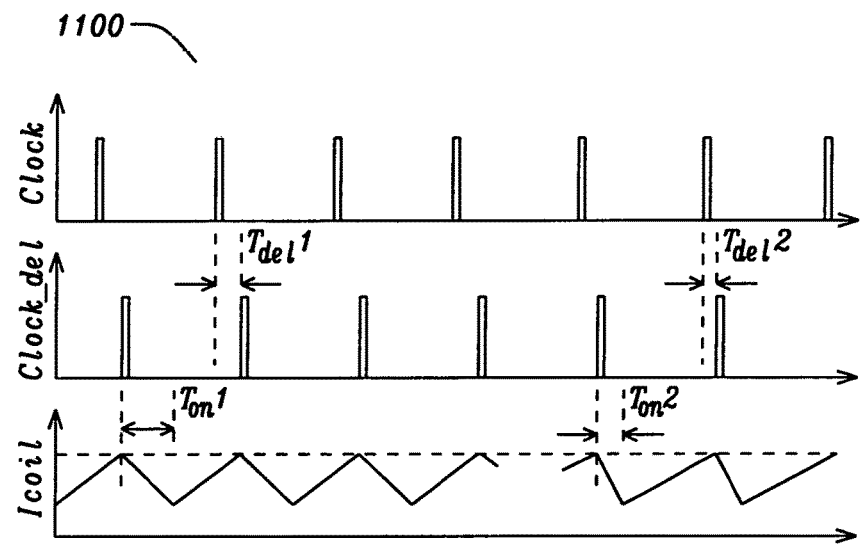
FIG. 11 shows the clocking of a buck converter delayed, and proportional to the on time of the preceding low-side output switch, in a third preferred embodiment of the present disclosure.

FIG. 11 shows the clocking of a buck converter delayed, and proportional to the on time of the preceding low-side output switch, in a third preferred embodiment of the present disclosure. In 1100, clock signal CLOCK is delayed to create clock signal CLOCK_DEL, and the delayed clock turns on the low-side switch of the buck converter. If the on time of the low-side switch for ICOIL, TON1, is relatively long, then the clock delay for CLOCK_DEL, TDEL1, is also relatively long. If the on time of the low-side switch for ICOIL, TON2, is relatively short, then the clock delay for CLOCK_DEL, TDEL2, is also relatively short.

Figure 12:
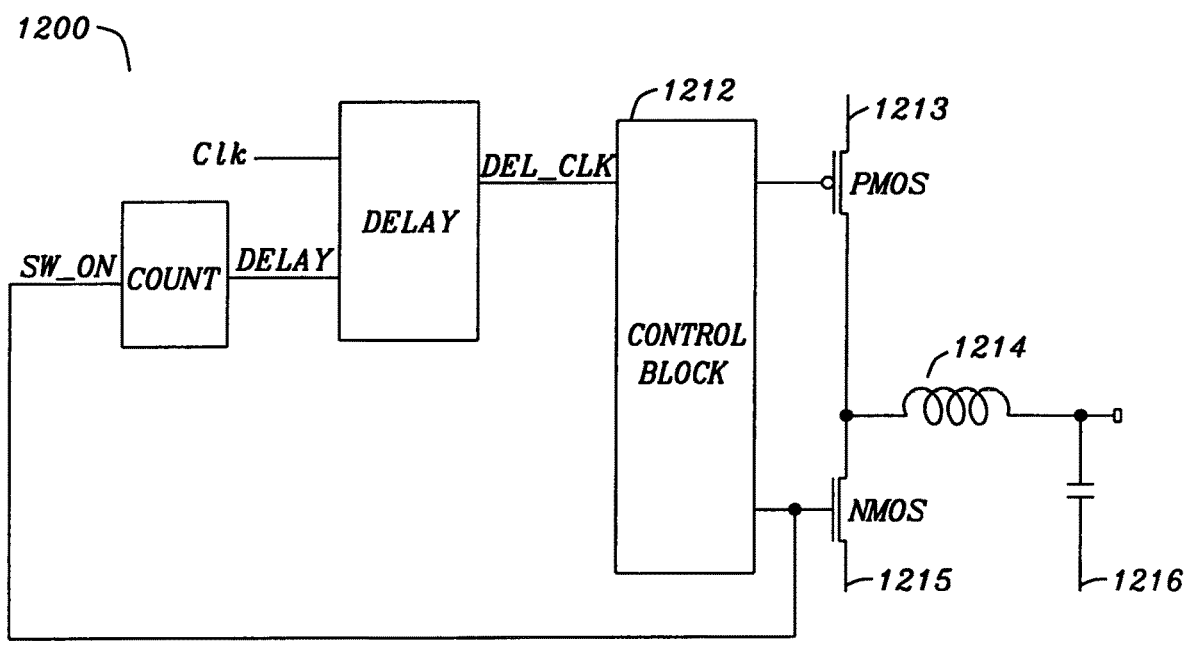
FIG. 12 illustrates a schematic for the implementation of a buck converter with clocking delayed, and proportional to the on time of the preceding low-side output switch, as shown in the timing diagram of FIG. 11.

FIG. 12 illustrates a schematic for the implementation of a buck converter with clocking delayed, and proportional to the on time of the preceding low-side output switch, as shown in the timing diagram of FIG. 11. In 1200, the on time of the low-side output switch SW_ON is measured using counter COUNT 1210. The counter then outputs signal DELAY to delay cell 1211. The delay cell then receives the master clock CLK and outputs a delayed clock DEL_CLK to buck control block 1212. The buck control block then controls output switches PMOS 1213 and NMOS 1215.

Low-side device 1215 is turned on by clock signal DEL_CLK. When the switch is on, the current in coil 1214 decreases linearly. Once the current in the coil reaches a threshold, low-side device 1215 turns off, and voltage data is stored on capacitor 1216. High-side device 1213 turns on, and the current in coil 1214 rises until the next clock cycle.

The circuit in FIG. 12 may be used for the other embodiments of the disclosure dependent on the on-time of the low-side switch. The on-time of the low side switch is counted, and the count data is used to set the clock delay proportional or inversely proportional to the count data. The FIG. 12 circuit could be used to delay a next clock pulse by an amount of time inversely proportional to the most recent on time of the low-side switch for peak-mode current control as shown in FIG. 7, or to delay a next clock pulse by an amount of time directly proportional to the most recent on time of the low-side switch for valley-mode current control as shown in FIG. 11.

FIG. 13 shows the clocking of a valley-mode buck converter delayed, and inversely proportional to the on time of the preceding high-side output switch, in a fourth preferred embodiment of the present disclosure. This variant is where the delay is no longer proportional to the low-side output switch on time, but is now inversely proportional to the high-side switch on-time. In 1300, the longer the high-side output switch is on for, the shorter the clock delay will be. The clock signal CLOCK is delayed to create clock signal CLOCK_DEL, and the delayed clock turns on the low-side switch of the buck converter. If the on time of the high-side switch for ICOIL, TON1, is relatively short, then the clock delay for CLOCK_DEL, TDEL1, is relatively long. If the on time of the high-side switch for ICOIL, TON2, is relatively long, then the clock delay for CLOCK_DEL, TDEL2, is relatively short.

FIG. 14 shows the clocking of a buck converter delayed, in valley-mode current control, in a fifth preferred embodiment of the present disclosure. In 1400, the clock is delayed by an amount inversely proportional to the time elapsed between the valley-mode current control signal which turns off the low side device, and the clock. The left side of FIG. 14 illustrates the scenario for a long high side device on time. The valley-mode control logic detects the low side device current, and turns the low side device off. The high side device turns on and coil current ICOIL starts to increase. After time TON1, CLOCK occurs and is delayed in CLOCK_DEL by TDEL1, a time inversely proportional to TON1. The delayed clock turns the high side device off, and coil current ICOIL starts to decrease, turning the low side device back on. When the time between the valley-mode control logic and the clock, TON1, is relatively long, the delay between the clock and the high side device being turned off, TDEL1, is short.

The right side of FIG. 14 illustrates the scenario for a short high side device on time. The high side device turns on and coil current ICOIL starts to increase. After time TON2, CLOCK occurs and is delayed in CLOCK_DEL by TDEL2, a time inversely proportional to TON2. The delayed clock turns the high side device off, and coil current ICOIL starts to decrease, turning the low side device back on. When the time between the valley-mode control logic and the clock, TON2, is reduced, the delay between the clock and the high side device being turned off, TDEL1, is increased. In this way the clock delay prevents sub-harmonic oscillation, by effectively adding a form of clock delay compensation to the valley-mode control.

In addition, the function is achieved by implementing a switching converter configured for voltage mode operation.

Figure 15:
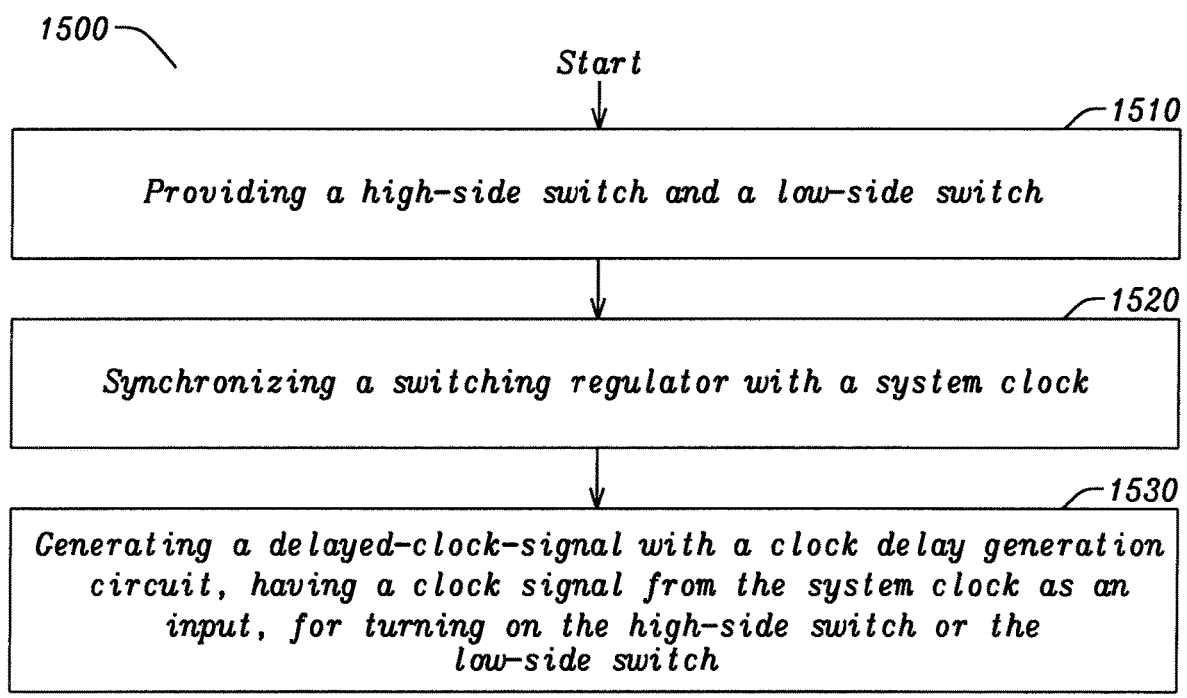
FIG. 15 illustrates a flowchart of a method disclosed for preventing sub-harmonic oscillation in a current-mode switching regulator.

FIG. 15 illustrates flowchart 1500, of a method disclosed for preventing sub-harmonic oscillation in a current-mode switching regulator. Step 1510 shows the provision of a high-side switch and a low-side switch. Step 1520 illustrates synchronizing the switching regulator with a system clock. Step 1530 shows generating a delayed-clock signal with a clock delay generation circuit, having a clock signal from the system clock as an input, for turning on the high-side switch or the low-side switch.

The advantages of one or more embodiments of the present disclosure include preventing sub-harmonic oscillation when a switching converter is in peak-current-mode or valley-mode control operation, allowing the switching converter to remain fully stable. The proposed method dramatically increases the accuracy of the current limit, increasing the maximum current the switching converter can provide and decreasing the PCB area the switching converter requires in a customer's application.

While this invention has been particularly shown and described with reference to the preferred embodiments thereof, it will be understood by those skilled in the art that various changes in form and details may be made without departing from the spirit and scope of the invention.

The invention claimed is:

1. A current-mode switching regulator, comprising:
   a high-side switch and a low-side switch;
   a clock delay generation circuit, having a clock signal input;
   said clock delay generation circuit further comprising:
   a counter configured to measure an on time of said low-side switch and to output a signal to a delay cell;
   said delay cell configured to receive said clock signal input and to output a delayed-clock signal to a control block; and
   said control block configured to control said high-side and said low-side switch;
   wherein said clock delay generation circuit is configured to delay a next clock pulse, with a delay time directly proportional to the most recent on time of said low-side switch while a coil current decreases linearly, for valley-mode current control;
   wherein said control block is configured to implement a current limit with valley-mode compensation;

wherein said high-side and low-side switches are configured to supply said coil current to an inductor; and further comprising a fixed bias current I1 and a fixed bias current I2, for an on time of said low-side switch, wherein the amount of clock delay with respect to said on time of said low-side switch is controlled as a function of fixed bias currents I1 and I2 and an amount of dine the high-side switch is on.

2. The current-mode switching regulator of claim 1, wherein said high side switch is a PMOS device and said low side switch is an NMOS device.

3. The current-mode switching regulator of claim 1, wherein said switching regulator is configured for voltage mode operation.

4. A method for preventing sub-harmonic oscillation in a current-mode switching regulator, comprising the steps of:
   providing a control signal to a high-side switch and a low-side switch;
   generating a delayed-clock signal, with a clock delay generation circuit, having a clock signal input;
   measuring an on time of said low-side switch with a counter and outputting a signal to a delay cell;
   receiving said clock signal input into said delay cell and outputting said delayed-clock signal to a control block;
   controlling said high-side switch and said low-side switch with said control block;
   implementing a current limit with valley-mode compensation; and
   supplying a coil current to an inductor with said high-side and low-side switches;
   wherein said clock delay generation circuit delays a next clock pulse, with a delay time directly proportional to the most recent on time of said low-side switch while said coil current decreases linearly, for valley-mode current control; and
   wherein said clock delay generation circuit delays said clock signal input, for an on time of said low-side switch, by a function of fixed bias currents I1 and I2 and an amount of time the high-side switch is on.

* * * * *